United States Patent [19]

Kammeyer

[11] Patent Number: 4,506,228
[45] Date of Patent: Mar. 19, 1985

[54] DIGITAL FM DETECTOR

[75] Inventor: Karl-Dirk Kammeyer, Paderborn-Dahl, Fed. Rep. of Germany

[73] Assignee: Robert Bosch GmbH, Stuttgart, Fed. Rep. of Germany

[21] Appl. No.: 405,318

[22] Filed: Aug. 5, 1982

[30] Foreign Application Priority Data

Sep. 26, 1981 [DE] Fed. Rep. of Germany ....... 3138464
Dec. 12, 1981 [DE] Fed. Rep. of Germany ....... 3149318
Jun. 21, 1982 [EP] European Pat. Off. ...... 82 105 412.9

[51] Int. Cl.$^3$ ............................................. H03K 9/04
[52] U.S. Cl. ...................................... 329/107; 329/50; 375/82
[58] Field of Search ................. 329/50, 107, 122, 124, 329/126; 375/80, 81, 82, 94; 328/167

[56] References Cited

U.S. PATENT DOCUMENTS 4,136,398  1/1979  Eggermont .................... 328/167 X
4,143,322  3/1979  Shimamura .................... 329/124 X
4,264,975  4/1981  Voorman ........................... 375/94

Primary Examiner—Eugene R. LaRoche
Assistant Examiner—Robert J. Pascal
Attorney, Agent, or Firm—Frishauf, Holtz, Goodman & Woodward

[57] ABSTRACT

FM Signals are demodulated on an entirely digital basis by converting the digitalized signal into a pair of signals which are substantially Hilbert transforms of each other. This requires at least one pair of nonrecursive filters having lower signal sample rates at the output than at the input. Each signal is delayed by one output sample interval, so that cross products of the delayed and undelayed Hilbert transforms can be formed, and the difference between them obtained. Finally, an arc-sine table is used to remove sine-function distortion. A single multiplier-accumulator provided with extra registers can perform all of the necessary arithmetical operations at the speeds required.

27 Claims, 16 Drawing Figures

DIGITAL FM DETECTOR

This invention concerns a digital demodulator for frequency modulated signals, by which, for example, FM broadcast signals can be demodulated by a circuit based on components widely available for digital electronic technology. It is broadly applicable for the wider introduction of digital technology for handling frequency modulated signals.

Frequency modulation detection is usually applied in the intermediate range of frequencies, for example at 10.7 MHz for FM broadcast signals and, like wise, for other FM radio reception, because of the wide availability of components for that frequency range. For frequency recognition in the intermediate frequency range, transition discriminators, utilizing simple counting methods, are disadvantageous because of the high count frequencies. High count frequencies require on the one hand a large loss of power through circuit losses in the present state of the art and, moreover, components for counting at high rates are expensive.

German patent publication DE-OS No. 30 07 907 discloses a digital receiver containing a digital demodulator, but the manner of construction of the demodulator and its manner of operation are not given in this disclosure. Circuits for digital demodulation other than frequency counting circuits were heretofore unknown.

THE INVENTION

It is an object of the present invention to provide a completely digital technique and apparatus for demodulating FM signals, in which the clock rates and sampling rates are minimized without appreciable impairment of the quality of the demodulated signal.

Briefly, the signal is digitalized in an analog-to-digital converter means and two signal sequences are produced which are substantially Hilbert transforms of each other). (a) A. Papoulis, the fourier integral and its applications, McGraw-Hill 1926). This requires passing two somewhat differently derived signal sequences through low-pass filters. The filter outputs are then delayed by one sample interval. A final multiplication stage multiplies the delayed signal of one branch by the undelayed signal of the other. Then the difference between the two final products is obtained in a subtraction circuit, and that difference is converted into the final demodulated signal by a table that generates the arc-sine or inverse sine function. The system involves sub-sampling the output of the digital filters at a fraction of the original sampling rate, and in one embodiment also involves another stage of filtering and sub-sampling before performing the steps of delay and final multiplication. The choice of the sampling frequency is important. Two basic ways of obtaining Hilbert transforms easily are available. Further explanation is better deferred to the detailed description given further below.

The detector system of the invention has the advantage that, in addition to being capable of construction with known digital electronic components, the results of the detection are absolutely reproducible and that no temperature or aging effects modify the behavior of the components or of the system. Calibration or balancing problems are avoided. The circuits can be produced with integrated circuit technology, especially because coils and large capacitances are not used in the circuits. The resolution of the signals can be made to be of any desired degree of precision and, likewise, there are possibilities of controlling the intermediate frequency bandwidth in a manner dependent upon the desired quality of reception, since this can be made to occur in a simple manner by digital signals or words.

It is particularly useful to produce the Hilbert transformation approximately by offset sampling, followed by interpolation. This strategy provides a particularly simple construction of the demodulator. It is further advantageous to provide amplitude control following the nonrecursive filters. Such amplitude control can be provided very quickly to avoid interference with the fidelity of FM detection. The correct function of the demodulator at high frequency deviations is thereby greatly improved.

By the use of multiplication by a sine function and by a cosine function, signals which are Hilbert transforms of each other are obtained after nonrecursive filtering without the necessity of an interpolation circuit. By these filters multiplication products involving the double intermediate frequency are suppressed. The use of additional nonrecursive filters and lowering the sample rate after each filter makes it possible to use cheaper components.

The nonrecursive filters can advantageously be constituted of shift registers or RAMs operating as storage units, in which case the coefficients determining the characteristics of the filter are embodied in the storage units.

BRIEF DESCRIPTION OF THE DRAWINGS

The invention is further described by way of illustrative example with reference to the annexed drawings, in which.

DESCRIPTION OF THE ILLUSTRATED EMBODIMENTS

The demodulators here described are particularly well suited for the demodulation of intermediate frequency signals of VHF and UHF broadcast receivers and other receivers that are most commonly equipped to operate with an intermediate frequency of 10.7 MHz, and it will be assumed for purposes of illustration that the center frequency of the intermediate frequency bandwidth is the widely used 10.7 MHz. The demodulators are also suitable for demodulation of other frequency modulated signals, as for example news and information transmission modulated onto carrier frequencies, either separately radiated or radiated in combination with other radiated signals.

In order to produce the demodulators of the invention economically, it is particularly important to take account of the density of integration and the operating speeds of digital components. The demodulators are therefore so designed that each partial system can be driven at the lowest sampling frequency that is theoretically possible under modern system theory. Unlike the null transition discriminators described in the introduction above, the demodulators of the present invention do not realize a high resolution of the time axis corresponding to the accuracy of determination of the momentary frequency, for reasons of the excessive sampling frequencies there involved. The demodulation principles described below involve a downward conversion of the intermediate frequency signal into the baseband region, in which the demodulator has the lowest operating frequency requirement that is possible.

Figure 1:
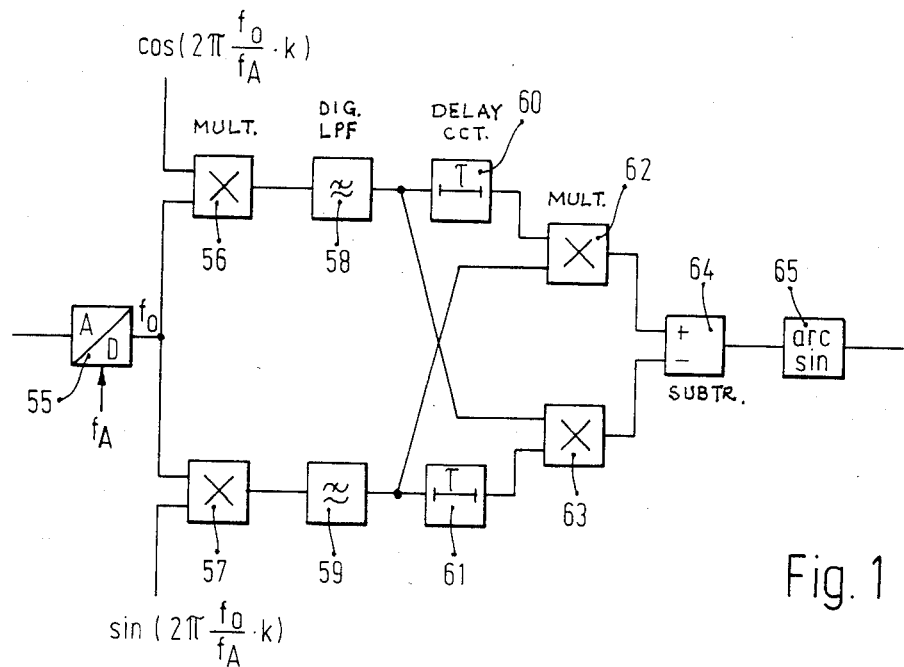
FIG. 1 is a basic block diagram of a digital FM demodulator according to the invention.

FIG. 1 shows a digital FM demodulator in basic circuit block form. The input signal of the demodulator is analog and is taken from an intermediate frequency amplifier not shown in the drawing. This signal is supplied to an analog-to-digital converter 55. At the output of the analog-to-digital converter 55, a sequence of digital words is produced, each of which may for example have a length of 8 bits. Each digital word is supplied both to a multiplier 56 and a multiplier 57.

The digital multiplication formed in multiplier 56 is multiplication by a cosine function with the carrier frequency $f_o$, which is present after the sampling performed in the converter 55. In the multiplier 57, multiplication by a corresponding sine function is performed. The multipliers 56 and 57 operate digitally.

A digital low-pass filter 58 follows the multiplier 56, and a digital low-pass filter 59 likewise follows the multiplier 57. A delay circuit 60 is connected at the output of the low-pass filter 58 and may, for example, be constituted of a parallel array of sixteen flipflops for the case of a digital word sixteen bits wide. A delay circuit 61 is likewise connected at the output of the low-pass filter 59.

Because of the quantization noise, a wider word should be provided at the filter output than at the input of the filter.

The digital word at the output of the delay circuit 60 is multiplied by the digital word at the output of the low-pass filter 59 in the multiplier 62. The output of the delay circuit 61 is likewise multiplied by the output of the digital filter 58 in the multiplier 63. The digital output of the multiplier 63 is subtracted from the output value of the multiplier 62 in a subtraction circuit 64. The output of the subtractor 64 is then given the final conversion into the desired demodulated signal by the inverse sine (arc-sine) table 65, provided as a read-only memory.

A frequency modulated signal is provided to the analog-to-digital converter 55 which has a prescribed carrier frequency, and the bandwidth of the signal is determined by the passband of the intermediate frequency filter (not shown) of the receiver. The analog-to-digital conversion is performed at both time intervals, and the analog-to-digital converter 55 is clocked at the sampling frequency. The minimum value of the sampling frequency is determined by the Shannon sampling theorem, in which the bandwidth of the intermediate frequency signal is of importance. As already mentioned, this bandwidth is essentially determined by an analog filter preceding the input to the analog-to-digital converter 55.

Each digital word appearing at the output of the analog-to-digital converter 55 is multiplied in the multiplier 56 by a cosine function. This cosine function must likewise be provided in digital form. In the illustrated example, the sampling is so chosen that a new intermediate frequency appears at the output of the analog-to-digital converter 55 having a mid-frequency value $f_o$, which is one quarter of the sampling frequency $f_A$, i.e., $f_o$ equals $f_A/4$. In general, the conditions to be fulfilled by the sampling frequency are $$f_A = \frac{4 f_{IF}}{4N \pm 1}, N = 1, 2, 3 \ldots$$

where the bandwidth of the analog input filter B must be $$\frac{2 f_{IF}}{4N \pm 1}.$$

$f_{IF}$ is the intermediate frequency before sampling. If that intermediate frequency, for example, is 10.7 MHz and if N is given the value 1, the sampling frequency obtained by the above formulae is 8.56 MHz. The new mid-frequency $f_o$ at the output in the output-to-digital converter than has the value 2.14 MHz. On the basis of this selection of the sampling frequency, the digital multiplication takes place at the instants of null transition and extreme values, respectively, of the cosine function. The multiplication in the multiplier 56 accordingly takes place exclusively at the multiplier values of $+1$, $0$ and $-1$ so that in circuit technology the multiplication is reduced to a change of sign. Since the multiplication, moreover, must take place in real time, a substantial circuit simplification is thus produced.

The multiplication by a sine function takes place in the digital multiplier 57.

By choice of the sampling frequency corresponding to that just described, the result can be obtained that the multiplication may likewise be performed only with the values 1, and $-1$, so that again merely changes of sine are to be produced. At the outputs of the multipliers 56 and 57, there accordingly appear signals that contain, along with the baseband signal, an additional term that contains the doubled carrier frequency. The signals that contain the doubled carrier frequency are suppressed by the following stage of low-pass filtering performed by the digital low-pass filters 58 and 59. The output signals of the filters 58 and 59 are Hilbert transforms of each other.

The output signals of the low-pass filters represent cosine and sine signals respectively, the arguments of which contain the integral of the useful signal. What is involved, therefore, are FM signals of carrier frequency zero. At the output of the low-pass filter 58 is present the term $$\tfrac{1}{2}\cos\left[\Delta\Omega \int_{-\infty}^{t} v\, dt\right]$$

while at the output of the low-pass filter 59 there is the signal $$\tfrac{1}{2}\sin\left[\Delta\Omega \int_{-\infty}^{t} v(\tau)\, d\tau\right]$$

In the above expressions, $\Delta\Omega$ represents the frequency deviation and $v$ the modulated dimensionless useful signal between the limits of $-1$ and $+1$. From these outputs, it is not possible to obtain a one-valued result, by formation of the inverse cosine of the output signal of the low-pass filter 58, or the like, because the integral of $z$ exceeds without limit the argument range $\pm\pi/2$. The solution is for this reason manyvalued.

The formation of a difference of the argument must therefore be performed in such a way that it remains within a defined interval. This can be successful by the operation described below:

$$g(kT) = -\tfrac{1}{2}\sin\left[\Delta\Omega \int_{-\infty}^{(k-1)T} v(\tau)\, d\tau\right] \cdot$$

$$\tfrac{1}{2}\cos\left[\Delta\Omega \int_{-\infty}^{kT} v(\tau)\, d\tau\right] = +$$

$$\tfrac{1}{8}\left\{\sin\left[\Delta\Omega \int_{(k-1)T}^{kT} v(\tau)\, d\tau\right] - \right.$$

$$\left. \sin\left[2\Delta\Omega \int_{-\infty}^{(k-1)T} v(\tau)\, d\tau + \Delta\Omega \int_{(k-1)T}^{kT} v(\tau)\, d\tau\right]\right\},$$

$$k = 1, 2, \ldots$$

For sufficiently high sampling frequencies, it is permissible to make the following simplification $$\int_{(k-1)T}^{kT} v(\tau)\, d\tau = v(kT) \cdot T.$$

This simplification produces exclusively linear distortions of the low-frequency signal (weak low-pass effect), which can be very simply compensated after the demodulation.

For executing the above-described relation and operation, the digital output signal of the low-pass filter 59 is multiplied by the most recent previous value of the output signal of the low-pass filter 58. The delay unit 60 accordingly has the task to delay the output signal of the low-pass filter 58 by one sampling interval, a function simply performed by storage devices, for example by a flipflop array of a width corresponding to the word width. Likewise, the output signal of the low-pass filter 58 is multiplied by the most recent previous value of the output signal of the low-pass filter 59 in the multiplier 63. At the output of the multiplier 62, there is now present the signal $$g(kT) = \tfrac{1}{8}\left\{\sin[\Delta\Omega v(kT)\cdot T] - \right.$$

$$\left. \sin\left[2\Delta\Omega \int_{-\infty}^{(k-1)T} v(\tau)\, d\tau + \Delta\Omega v(kT)\cdot T\right]\right\},$$

while at the output of the multiplier 63, the signal $$g(kT) = \tfrac{1}{8}\left\{-\sin[\Delta\Omega v(kT)\cdot T] - \right.$$

$$\left. \sin\left[2\Delta\Omega \int_{-\infty}^{(k-1)T} v(\tau)\, d\tau + \Delta\Omega v(kT)\cdot T\right]\right\}.$$

appears.

After a subtraction of one of the two output signals of the multiplier 62 and 63 from the other in the subtraction circuit 64, the demodulated output signal is available as a sine function. The output signal of the subtractor 64 then has the form $$\tfrac{1}{4}\sin(\Delta\Omega \cdot v(k^T)\cdot T).$$

The useful signal can be obtained unambiguously by the inverse sine operation, which can be performed, for example with an arc-sine table 65 most conveniently provided in a ROM. The requirement for a single-valued function is that the argument of this sine function remains between the limits $+\pi/2$ and $-\pi/2$, so that the useful signal can be unambiguously obtained from the arc-sine operation. This requirement leads to a minimum sampling frequency for the demodulator that must not be understepped. For a frequency deviation of 75 KHz, as is for example usual with broadcast signals, a minimum sampling frequency of the demodulator portion of the circuit of 300 KHz results from these considerations. It is advantageous to make the sampling frequency somewhat higher, for example in the region of 500 KHz. Because of the low sampling frequencies that are possible after the filtering, the sampling rate at the output of the low-pass filters 58 and 59 can advantageously be reduced. A practical embodiment is described further below. Since at the same time the requirements of the Shannon sampling theorem are to be fulfilled, the bandwidth of the low-pass filter must not exceed half the sampling frequency.

Frequency detuning in the analog mixer stages preceding the demodulator give rise to a digital d.c. component in the demodulator, so that the d.c. component can, if desired, be used for backwards acting control of the tuning (AFC).

For the correct function of the demodulator, a constant amplitude of the frequency modulated signal is necessary. Amplitude fluctuations must therefore first be regulated out by an analog AGC control in the IF circuits. Only thus is an optimum swing of the analog-to-digital converter possible. Rapid amplitude fluctuations, which appear for example as IF interference, can effectively be regulated out digitally by a multiplier in the signal path. A criterion for the necessary amplification factor may be obtained from the output signals of the low-pass filters 58 and 59. The sum of the squares of the output signals of the low-pass filters 58 and 59 corresponds for every sampling instant to the square of the instantaneous amplitude. A correction is thereby possible for the amplitude in the case of each sample value. Multiplicative amplitude errors can thus be quickly regulated out. Features and details regarding the design of digital filters, such as the filters 58 and 59, are to be found, for example, in the book by B. Gold, Ch. M. Rades, Digital Processing of Signals, New York, McGraw-Hill (1969).

It is desirable to utilize nonrecursive filters, since they offer the advantage of linear phase. Such a solution is attractive because, on the basis of a precisely constant group propagation time, non-linear distortions of the low-frequency signal is reduced or avoided and stereo channel separation can be noticeably improved. Nonrecursive filters require high component expense for multiplication, which can be reduced only by keeping the sampling frequencies in each portion of the system as low as possible and, additionally, providing sub-sampling at the output. Similar considerations apply also to the analog-to-digital converter. For correctly obtaining an unfiltered output signal from the IF mixer, sampling frequencies of the order of magnitude of 50 MHz are required if the Shannon sampling theorem is observed. This value can be substantially reduced if an analog bandpass filter, with its mid-frequency set to the carrier frequency, is provided ahead of the analog-to-digital converter. That mid-frequency can, for example, be at 10.7 MHz. This bandpass filter should on the one hand be broad enough to produce no noticeable phase distortion of the useful signal in its frequency range and, on the other hand, its bandwidth must be narrow enough to provide a substantial reduction of the sampling rate of the analog-to-digital converter. For VHF reception of broadcast signals having a frequency deviation of ±75 kHz, a bandwidth of 2 MHz is advantageous, for example. A circuit block diagram of a digital demodulator equipped with nonrecursive filters suitable for operation involving the frequency figures given above will now be explained with reference to FIG. 2.

An intermediate frequency amplifier equipped with a bandpass filter, neither of which is shown in the drawing, supply the input to an analog-to-digital converter 70, the output of which is connected to each of the multipliers 71 and 72. Digital multiplication with a cosine function takes place in the multiplier 71, while digital multiplication with a sine function takes place in the multiplier 72. By suitable choice of the sampling frequency of the analog-to-digital converter, it is possible to provide that from the point of view of circuit design, only reversal of sine needs to be provided in the multipliers.

A nonrecursive filter 73 follows the multiplier 71 and provides an output which is sampled at a lower frequency by means of the switch 75. Following the switch 75 is provided another nonrecursive filter 77, the output of which is again sampled by a switch 79. The switch 79 operates at a lower frequency than the switch 75. It is practical to provide such a switch by a register that is so stepped or clocked that, for example in the case of a sub-sampling factor of 4—only every fourth value of the input data sequence will be picked up. The output signal of the switch 79 is delayed in every case by one sampling interval by means of the delay unit 81.

The output signal of the multiplier 72 is prepared in the same way. The nonrecursive filter 74 follows the multiplier 72 and provides an output which is sampled with the switch 76. The sampling frequencies of the switches 75 and 76 are the same. Another nonrecursive filter 78 follows the switch 76 and provides an output signal that is sampled by the switch 80. The operating frequency of the switch 80 is identical with that of the switch 79. The output signal of the switch 80 is supplied on the one hand to the input of the digital multiplier 83 and on the other hand to the delay unit 82, which delays the output signal of the switch 80 by one sampling interval. The other input of the multiplier 83 is supplied by the output signal of the delay unit 81. At the outputs of a multiplier 84, there are on the one hand the output signal of the switch 79 and on the other hand the output signal of the delay unit 82. The output signal of the multiplier 84 is subtracted from the output signal of the multiplier 83 in a digital subtraction. The arc-sine table 86 follows the subtraction stage 85 in this illustrated case in a manner analogous to FIG. 1.

A clock pulse generator supplies the sampling frequency for the analog-to-digital converter 70. A 1:4 divider 68 is conected to the clock pulse generator 67 and provides the operating frequency for the switches 75 and 76. The output of the dividing circuit 68 is supplied to the input of another dividing circuit 69, which again divides the sampling signal by four. The output signal of the divider 69 serves to control the switches 79 and 80.

Figure 4:
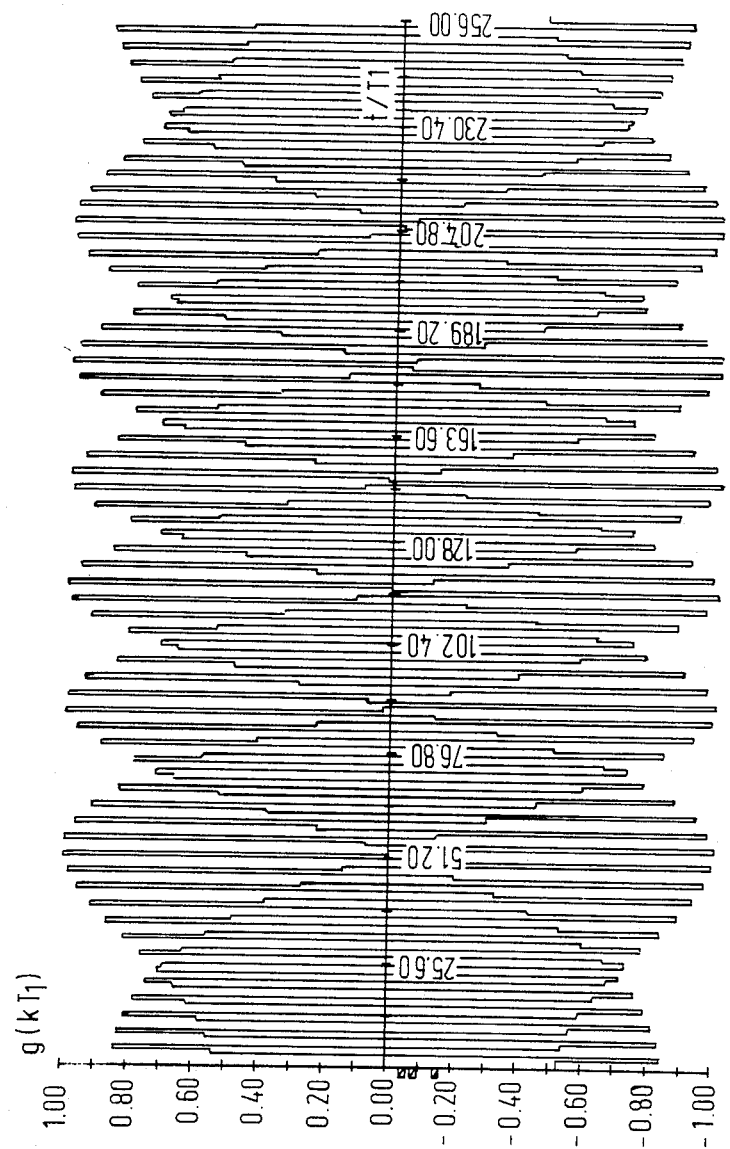
FIG. 4 is a graphical illustration of a frequency-modulated digitalized signal.
Figure 5:
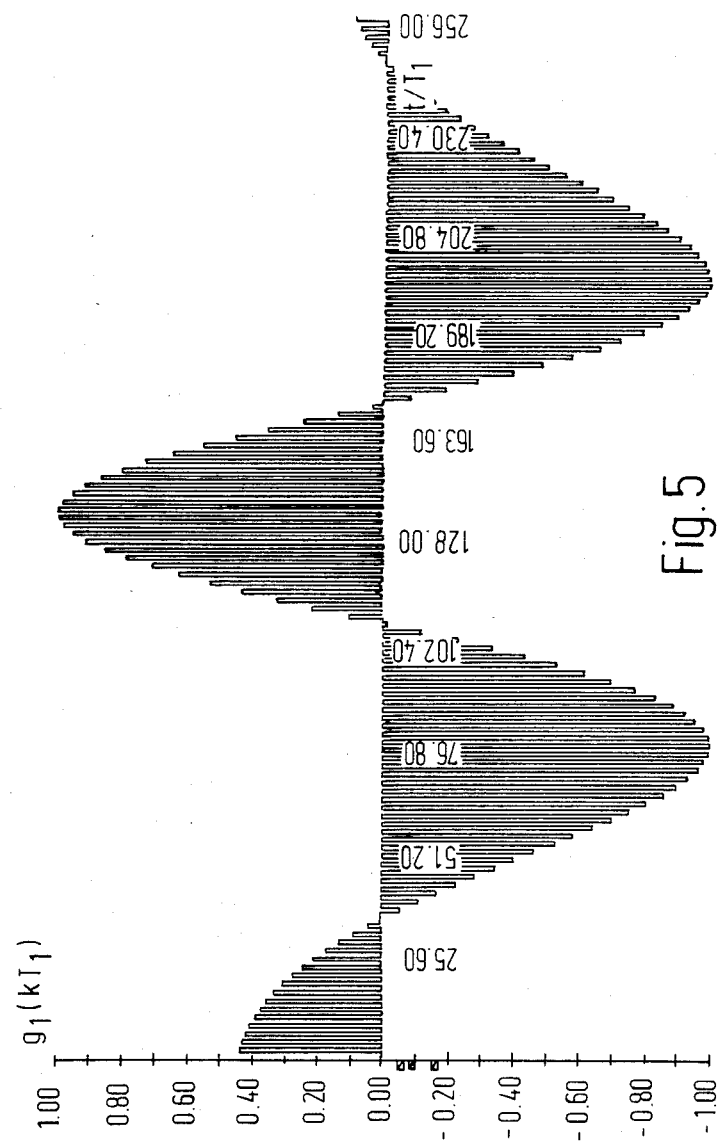
FIG. 5 is a similar graphical representation of a signal after carrier multiplication.
Figure 6:
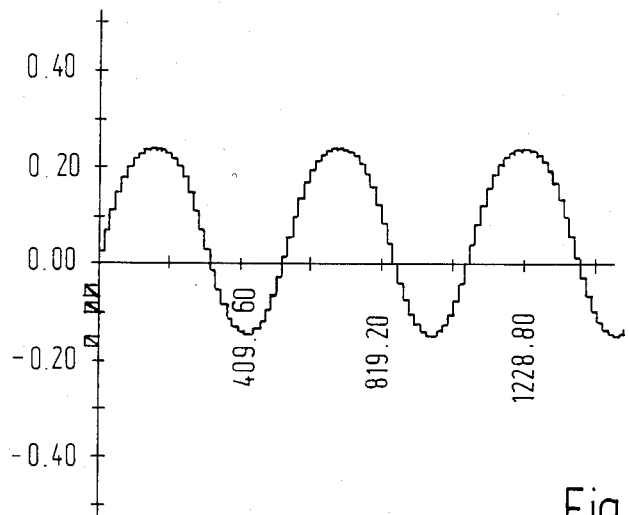
FIG. 6b shows the output signal of the subtractor in the case of frequency detuning.
FIG. 6c shows a low-frequency signal with FM bandwidth limiting.
Figure 6:
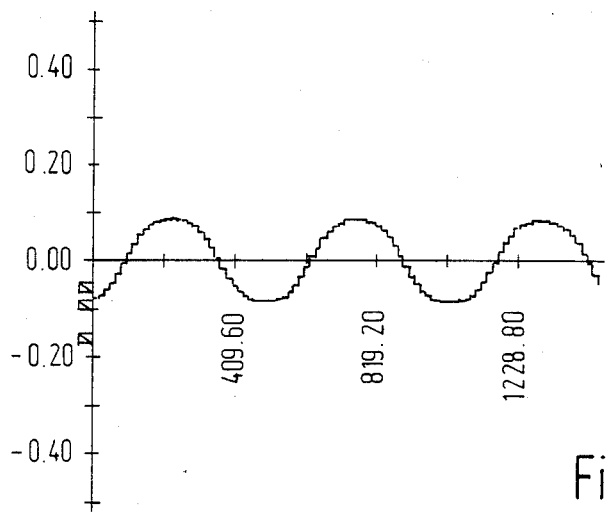

The operation of this circuit can best be understood with reference to FIGS. 3 to 6. In FIGS. 4 and 5, the digital signal values are plotted as amplitudes on the axis of ordinates.

Figure 14:
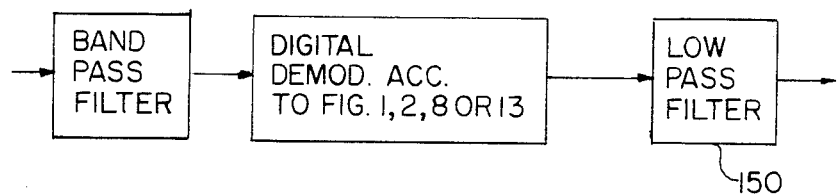
FIG. 14 (on the same sheet as FIG. 1) is a block diagram illustrating the use of additional filters respectively before and after a digital demodulator.

The input signal is to be sampled by the analog-to-digital converter 70 at a sampling frequency that is as small as possible. For this, the clock pulse generator 67 must deliver a signal of which the frequency is at least twice the value of the bandwidth of the analog bandpass filter (see FIG. 14) that precedes the analog-to-digital converter 70. A further condition to be respected at the original intermediate frequency signal is transformed into a lower intermediate frequency range by the sampling. In the interest of simple construction of the multipliers 71 and 72, the intermediate frequency should be ¼ of the sampling frequency. This can be obtained if for the sampling frequency, for example, a frequency is chosen which is 4/5 of the input intermediate frequency. If the bandwidth of the preceding IF filter should, for example, be 2 MHz and the intermediate frequency 10.7 MHz, a suitable sampling frequency is then 8.56 MHz. On the basis of the above-given formulae, a lower IF of ¼ of the sampling frequency results, so that the lower IF frequency is then 2.14 MHz.

As shown in line (a), there is produced among other things at the new carrier frequency of 2.14 MHz, a new FM spectrum, this digital spectrum having a bandwidth of 2 MHz in accordance with the input analog filtering. After the quadrature demodulation by the multipliers 71 and 72, there is produced in each case, along with the baseband signal, a spectrum about the doubled carrier frequency, as shown in graph (b) of FIG. 3. When the carrier frequency is 2.14 MHz, this additional spectrum is grouped about the frequency 4.28 MHz. The nonrecursive filters 73 and 74 suppress the additional spectrum just mentioned. The frequency effect of these nonrecursive filters is shown in broken lines in graph (b) of FIG. 3. Since the maximum frequency in the output signals of the low-pass filters 73 and 74 is about 1 MHz, the sampling frequency at the output of the low-pass filters can be reduced by the factor 4. The switches 75 and 76, accordingly, probe the output signals of the respective low-pass filters 73 and 74 at a frequency of about 2.14 MHz. This step is of importance insofar as it reduces greatly the cost of the following selective narrowband filtering. That is, if this task of the low-pass filters 73 and 74 were included, the filter grade would be 4 times higher compared with the following filters, because of the fourfold sampling rate. The nonrecursive filters 77 and 78 have the task of filtering the useful signal out of the 1 MHz wide baseband, where the bandwidth in the case of VHF broadcasting is limited to about 150 KHz. The behavior of these low-pass filters is illustrated in graph (c) of FIG. 3. The minimum required frequency for sampling accordingly is about 300 KHz. This value corresponds also to the minimum sampling frequency that was necessary in the circuit of FIG. 1 for single-valued results of the arc-sine operation. In a concrete illustrative example, the sampling frequencies for the switches 79 and 80 was set at 535 KHz. The further processing of this signal then takes place in the multipliers 83 and 84, and then in the subtraction circuit 85, where the same operations are performed that were already described with reference to FIG. 1.

The decisive economic aspect of the circuit here described is to be found in the provision of the second nonrecursive filter pair, regarding the details of which reference is made again to the publication previously referred to. As can be recognized from line (b) of FIG. 3, the skirt steepness of the first low-pass filter is determined essentially by the spacing between the baseband and the next signal band. Furthermore, the expected attenuation outside the passband is also important for the design. If the 6 dB cut-off frequency for the first nonrecursive low-pass filter is chosen to be at a frequency of 2.14 MHz and the filter is then calculated according to the method of modified Fourier approximation, there results, for an attenuation of, for example, 65 dB, a filter order of 18, with half of all coefficients becoming zero because of the Nyquist edge or flank about $f_A/4$. Because of the linear phase characteristic of the nonrecursive filters, moreover, the filter coefficients are matched in equal pairs. Altogether, five multiplications are to be carried out for the digital filtering in each case, so that for each multiplication there is available about 1/5 of the output sampling period of the filter.

The principal expense of this circuit remains in the low-pass filters 77 and 78, which fully corresponds to the low-pass filters 3 and 4 and 95 and 96. This system works with an input sampling frquency of 2.14 MHz. In the design of this filter, in which it is sought to obtain a frequency characteristic with a cosine roll-off edge, the modified Fourier approximation was again used for calculation. For a 6 dB transmission frequency of 80 KHz, a filter was obtained with a order of 38. If in this case symmetrical coefficients are postulated, nineteen multiplications need to be carried out each time during a sampling interval at a sampling frequency of 2.14 MHz. For carrying this out, there is available the method of the so-called "distributed arithmetic" by which the multipliers and adders are replaced by a certain investment in fixed value memories (ROMs) and an accumulator.

Figure 6A:
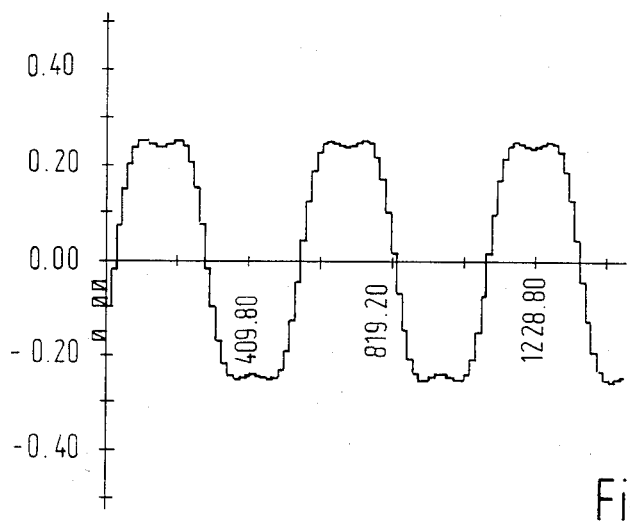
FIG. 6a shows the output signal of the subtractor of FIG. 2 in the case of overmodulation of the carrier.

FIG. 4 shows the digitalized FM signal as it appears at the output of the analog-to-digital converter 70 in the form of digital words. In FIG. 5, the output signal of the multiplier 71 is shown. The transformation into the baseband is already to be seen. FIGS. 6a, 6b and 6c show the output signal that comes out of the subtractor 85. FIG. 6a shows an output signal for a case of overmodulation of the carrier. FIG. 6b shows the digital signal that results in case of frequency mistuning. Here, there is clearly recognizable the d.c. component that can be used to provide automatic frequency control. FIG. 6c shows a low-frequency signal obtained with FM bandwidth limiting.

Figure 7:
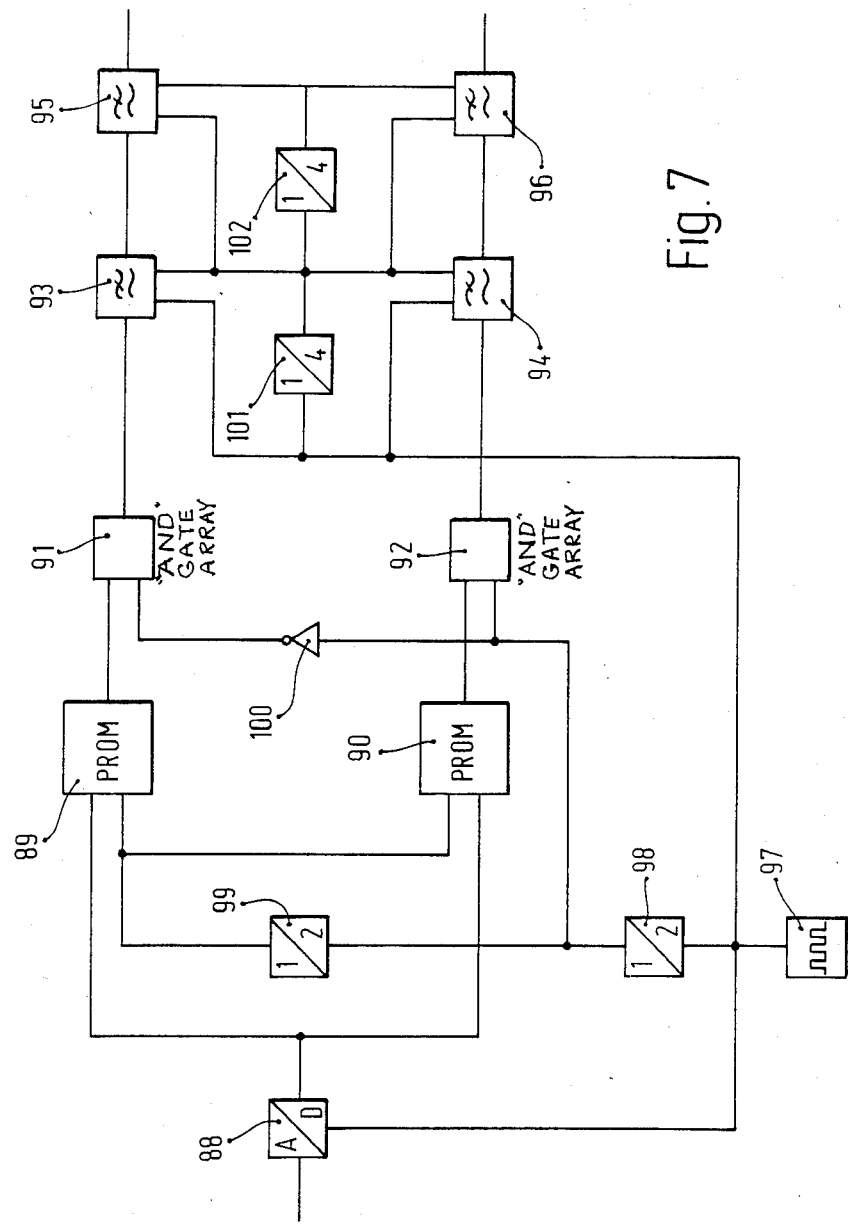
FIG. 7 shows a practical embodiment of the demodulator illustrated in FIG. 2.

FIG. 7 shows a concrete embodiment of the demodulator according to the circuit which is provided to an analog-to-digital converter 88, the output signal of which is provided to the PROM 89 and to the PROM 90. The output of the PROM 89 is supplied to one input of an AND-gate array 91, while the output of the PROM 90 is supplied to one input of an AND-gate array 92. The output of the AND-gate 91 goes to a nonrecursive filter 93. The output of the nonrecursive filter 93 then proceeds to the input of still another nonrecursive filter 95. The output of the nonrecursive filter 95 proceeds to the components illustrated in FIG. 2, in this case the delay unit 81 and the digital multiplier 84. The nonrecursive filter 94 is connected to the output of the AND-gate array 92. The filter output proceeds to the input of the nonrecursive filter 96, the output of which is provided to the delay unit 82 and to one input of the multiplier 83 which correspond to connections shown in FIG. 2.

A clock pulse generator 97 supplies sampling signals to the analog-to-digital converter 88, the low-pass filter 94 and the low-pass filter 93. A frequency divider is connected to the clock pulse generator 97 and divides the clock pulse frequency by two. The output of the divider 98 is provided to the input not yet mentioned of the AND-gate array 92 and through the inverter 100 to the input not yet mentioned of the AND-gate array 91. A second divider 99 follows the divider 98 and likewise divides its input frequency by two. The output of the frequency divider 99 is supplied to the clock inputs of the respective PROMs 89 and 90. The output of the clock pulse generator 97 is also provided to a frequency divider 101 that divides the frequency by four. The outputs of the nonrecursive filters 93 and 94 and the inputs of the nonrecursive filters 95 and 96 are clocked by the output signal of the divider 101. Another scale of four divider 102 is connected to the output of the divider 101, and it clocks the output signals of the nonrecursive filters 95 and 96.

Figure 2:
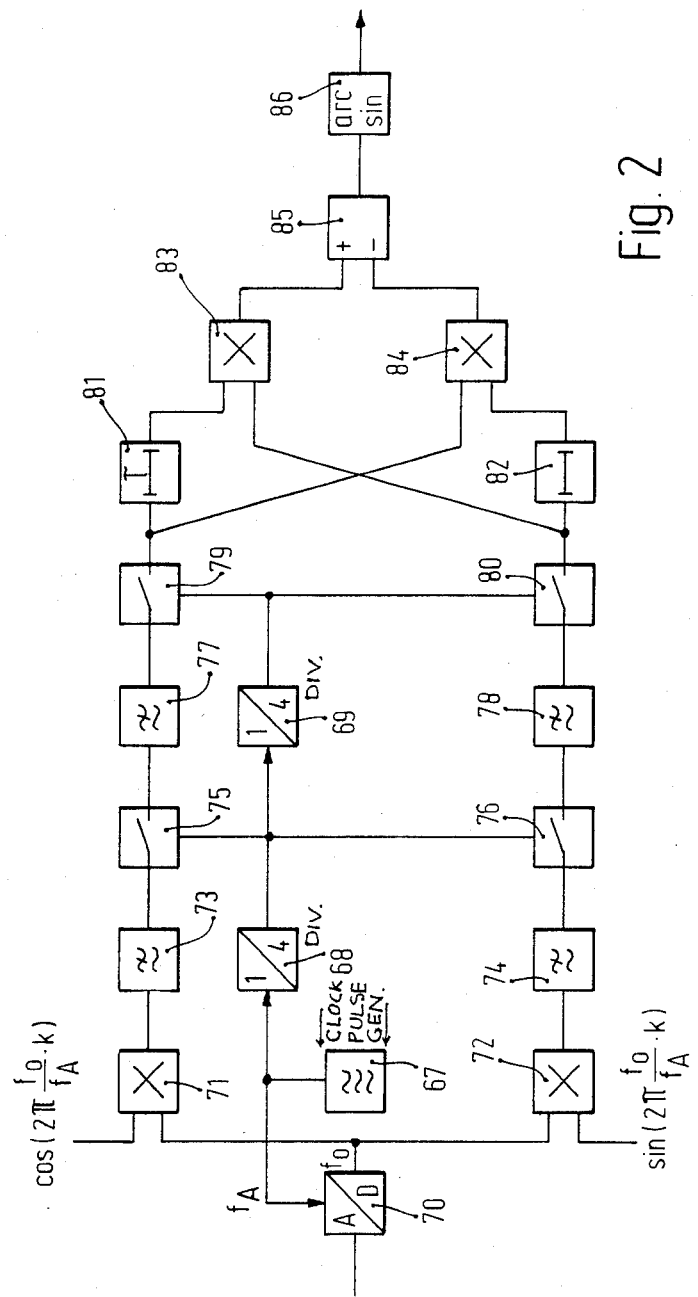
FIG. 2 is a detailed block circuit diagram of the digital FM demodulator according to FIG. 1.
Figure 3:
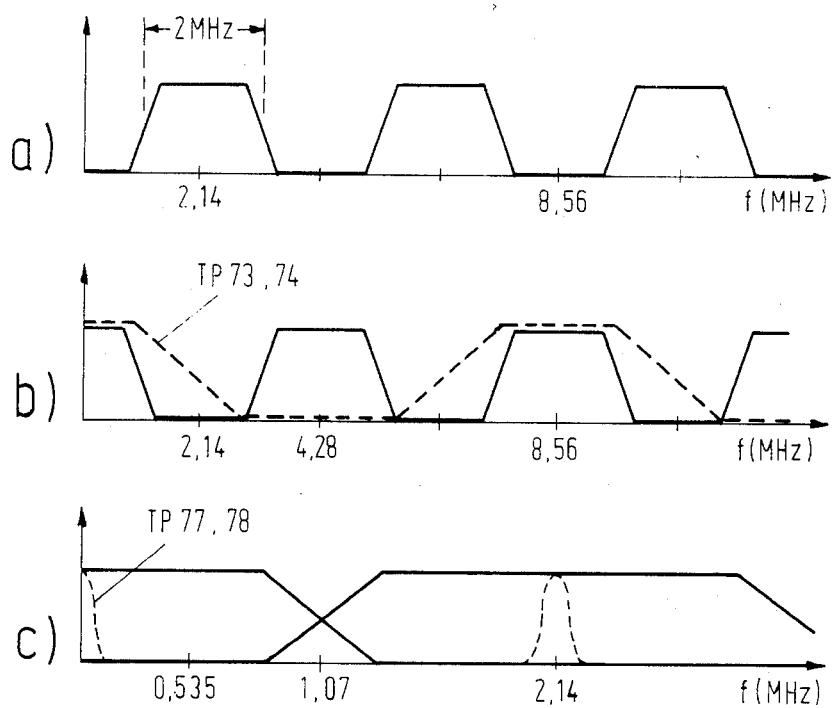
FIG. 3 shows a set of frequency diagrams illustrating signal bands and filter characteristics at various stages of the circuit of FIG. 2.

This circuit is a simple and straightforward example of a practical embodiment of the circuit block diagram of FIG. 2. The clock pulse generator 97 operates in this example at a frequency of 8.56 MHz when a signal with a mid-frequency of 10.7 MHz and a bandwidth of 2 MHz are applied to the input of the analog-to-digital converter 88. After conversion the digital signals are applied to the ROMs 89 and 90. The ROMs take over the task of providing, in accordance with the signal at the clock input, an output which is either the unchanged digital word at the input, the inverted digital word or zero. The division of clock pulse frequency by the dividers 98 and 99 has the effect that every fourth word appearing at the input of the ROMs is inverted. The digital words thus provided are blocked by the AND gates 91 and 92. By the circuit so far described, the result is obtained that multiplication with the cosine or multiplication with the sine, as such, is dispensed with, and instead the data words come out that the extreme values 1 and −1 had the zero transitions of the cosine and sine function. The digital signal at the output of the AND-gate array 91, accordingly, corresponds to the output signal of the analog-to-digital converter 88, multiplied cyclically by 1, 0, −1, 0, etc. At the output of the AND-gate array 92, the signal sequence of the output of the analog-to-digital converter 88 appears as multiplied by the signal sequence 0, 1, 0, −1, etc. In this manner, it is possible to get around any need for relatively expensive multipliers at the high sampling frequencies. An illustrated example of the nonrecursive filters 93 and 96 will be described further below.

Figure 8:
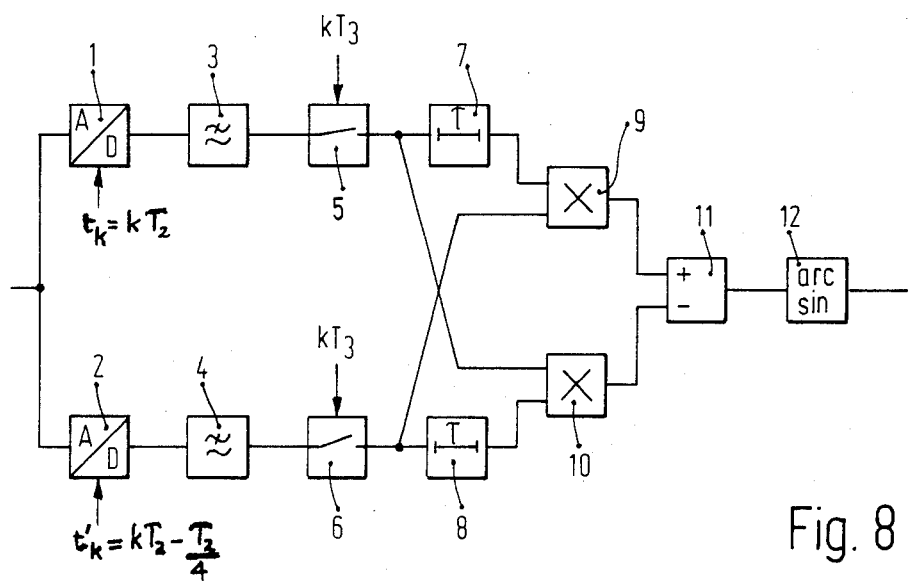
FIG. 8 is block circuit diagram of another demodulator according to the invention in modified form.

With a somewhat different kind of sampling, it is possible to dispense with the filters 73 and 74 and the filters 93 and 94 altogether. In this case, two analog-to-digital converters are necessary that operate at ¼ of the sampling frequency of the analog-to-digital converter 88 ($f_{A2}=f_A/4$) and also with sampling offset by $T_2/4$. The circuit block diagram for this principle of digital demodulation is shown in FIG. 8. The output signal of the intermediate frequency amplifier goes, on the one hand, to an analog-to-digital converter 1 and, on the other hand, to another analog-to-digital converter 2. The sampling in the analog-to-digital converter 1 takes place shifted in phase by ($T_2/4$) compared to the analog-to-digital converter 2. Following the analog-to-digital converter 1, is a low-pass filter that again is constructed as a nonrecursive filter. The output signal of the low-pass filter 3 is subsampled by a switch 5, reducing the sampling frequency by the factor 4. The subsamples go to a delay unit 7, the output of which goes to the input of a multiplier 9. A low-pass filter 4 follows the analog-to-digital converter 2, and its output is subsampled by a switch 6, reducing the sampling frequency by four. The switches 5 and 6 are driven at the same sampling frequency. The output of the switch 6 leads, on the one hand, to one input of the multiplier 9 and, on the other hand, to a delay unit 8, the output of which is provided to one input of a multiplier 10. At the other input of the multiplier 10, there is connected the output of the switch 5. A difference-forming stage 11 subtracts the output of the multiplier 10 from the output of the multiplier 9. The output of the subtractor 11 is then supplied to an arc-sine table.

As the result of the relative time shift in the sampling in the analog-to-digital converters by T/4, the output signals are no longer precisely Hilbert transforms of each other. This could be compensated in the following low-pass filters 3 or 4. That, however, would lose the coefficient symmetry in at least one of these two high-grade filters, which would provide substantial extra expense in providing the circuits of the filters. A simple possibility is to compensate out the errors from the offset sampling by a linear interpolation.

Because of the elimination of one low-pass filter, the sampling frequency for the analog-to-digital converter under the conditions provided in broadcast reception, with respect to the IF stage, could for example be selected to be 2.14 MHz. With this sampling, there is produced a direct conversion to the baseband. The sampling frequency $f_{A2}$ must be greater than the bandwidth of the analog bandpass filter provided ahead of the input and, furthermore, the ratio of intermediate frequency to sampling frequency must be a ratio of integers. If the interger chosen is 5, there is provided for the sampling frequency $f_{A2}$ a frequency of 2.14 MHz. The switches 5 and 6 preferably operate at ¼ of the frequency of sampling in the analog-to-digital converter. Its sampling frequency, accordingly, is 535 KHz.

Figure 9:
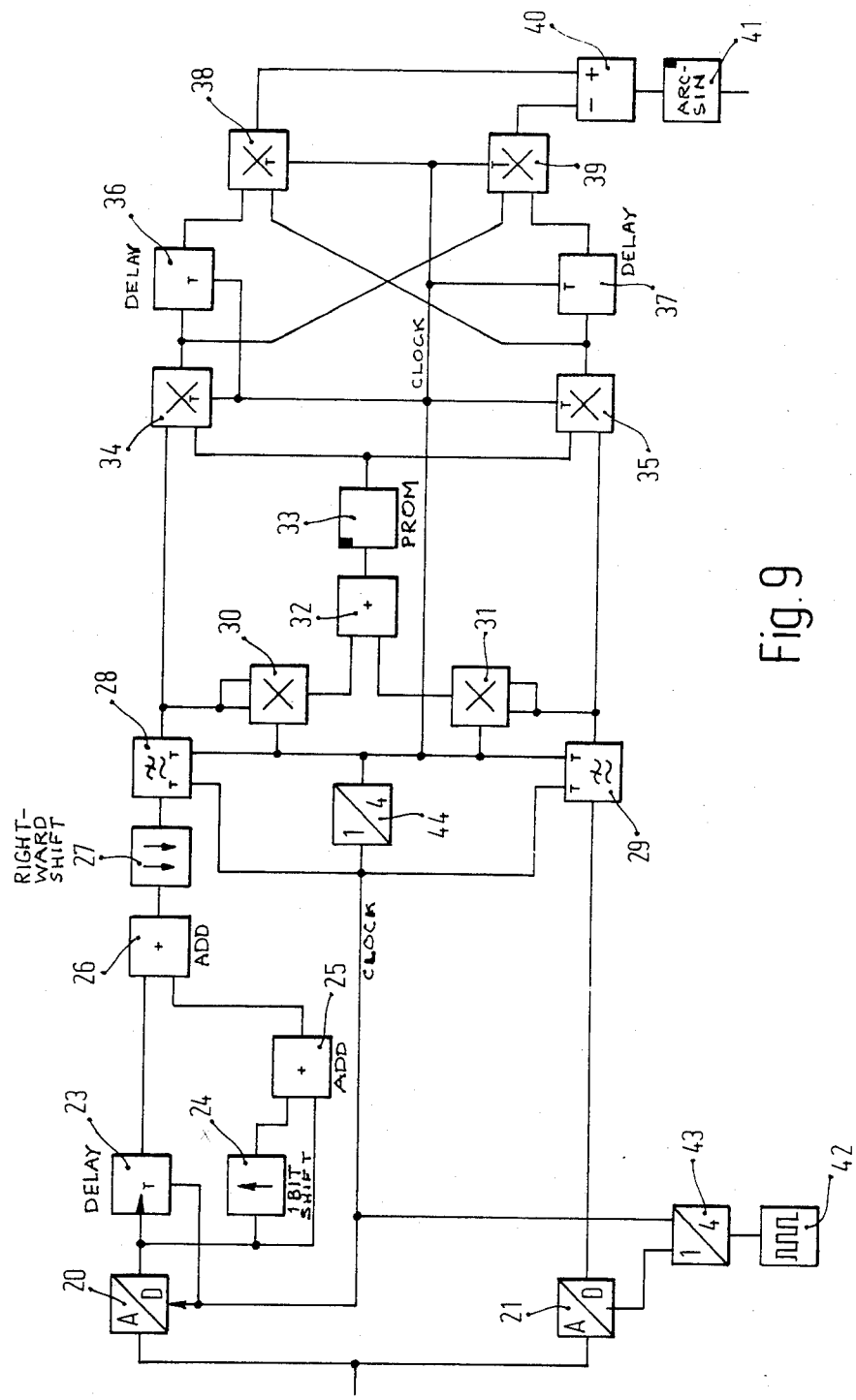
FIG. 9 is a detailed illustrative embodiment of the demodulator of FIG. 8.

FIG. 9 shows a comprehensive circuit block diagram for an embodiment of a demodulator according to FIG. 8. For correction of the time-shifted sampling in this case, the method of linear interpolation is used, and for amplitude correction, resort is made to squaring the Hilbert-transformed signals. The analog output signal of the intermediate frequency filter is supplied to an analog-to-digital converter 20 and to an analog-to-digital converter 21. The output of the analog-to-digital converter 20 proceeds, on the one hand, to a delay unit 23 constituted as a flipflop group. On the other hand, the output signal of the analog-to-digital converter 20 proceeds to an addition circuit 25 and to a one-bit leftward shifter 24, which corresponds to providing multiplication of the word by 2. The output signal of the one-bit shifter 24 is supplied to another input of the addition circuit 25. The output of the addition circuit 25 and the output of the delay unit 23 are each connected to one input of the addition circuit 26. At the output of the addition circuit 26, a rightward shifter 27 is connected for shifting the input to the right by two bits. This corresponds to a multiplication of the word by ¼. The input of the nonrecursive filter 28 follows the shifter 27. The output of the nonrecursive filter 28 leads to a squaring circuit 30, the output of which is in turn connected with an input of an addition circuit 32. The output of the addition circuit 32 is connected to one input of a PROM 33. The output of the PROM 33 follows the output of the recursive filter 28 are supplied each to one input of a multiplier 34. The output of the multiplier 34 is connected to a delay unit 36, an ouput of which is supplied in turn to one input of a multiplier 38.

The output signal of the analog-to-digital converter 21 is connected to the input of a nonrecursive filter 29, the output of which is again connected on the one hand with the squaring circuit 31 and on the other with the input of a multiplier 35. The output of the squaring circuit 31 is connected to another input of the addition circuit 32. The output of the PROM 33 is likewise connected to an input of the multiplier 35. The output signal of the multiplier 35 is connected on the one hand to one input of the multiplier 38 and on the other hand through a delay unit 37 to one input of the multiplier 39. The other input of the multiplier 39 is connected with the output of the multiplier 34. The outputs of the mutlipliers 38 and 39 are supplied to a subtractor 40. The output of the addition circuit 40 is supplied to a ROM 41, which contains the arc-sine table. The digital demodulator signal is obtainable at the output of the arc-sine table 41.

A clock pulse generator 42 oscillates at four times the maximum sampling frequency. The output signal of the generator 42 is supplied to a frequency divider 43 that delivers two output signals offset by each other by $T_2/4$. With one of these output signals, the analog-to-digital converter 21 is sampled, and with the other output signal of the pulse generator, the analog-to-digital converter 20 is sampled. The latter pulse signal also proceeds to the delay unit 23 and to the loading inputs of the nonrecursive filters 28 and 29. Furthermore, a divider 44 is connected to the frequency divider 43 and produces division by four. The output signal of the divider 44 clocks the nonrecursive filters 28 and 29, the input and output registers of the squaring circuits 30 and 31, and the multipliers 34,35,38 and 39, as well as the delay units 36 and 37.

The analog-to-digital converters 20 and 21 convert the FM signal into a sequence of digital words, the analog-to-digital converter 21 operating with its sampling offset by the interval T/4 ($\frac{1}{4}$ sampling period). The signals provided at the outputs of the analog-to-digital converters 20 and 21 are indeed, in essence, Hilbert transforms of each other, but they nevertheless have a time-offset between them. The resulting errors can be compensated out by a linear interpolation of the output signal of the analog-to-digital converter 20 and by a corresponding backreckoning. This is performed by multiplying the most recent previous value by $\frac{1}{4}$ and adding it to the present value multiplied by $\frac{3}{4}$. The multiplications are carried out by fixed-wired shift and addition circuits. The factor 3 is produced in the adding circuit 25 after the present signal is first shifted one bit to the left in the shift unit 24, in order to multiply it by two, so that its output can then be added to its input in the adding circuit 25. The most recent previous signal is provided at the output of the delay unit 23. The output of the adder 25 and the previous signal are added together in the circuit 26, and the sum thus produced is then multiplied by $\frac{1}{4}$ by shifting it to the right in the two-bit shifter 27. The output signal from the shifter 27 is, within very slight neglected errors of approximation, Hilbert-transformed with respect to the output signal of the analog-to-digital converter 21. The effect of the nonrecursive filters 28 and 29 has already been described in detail above.

It has already been mentioned above that an amplitude correction for rapid amplitude disturbances would be desirable. To obtain such a correction, the two output signals of the nonrecursive filters 28 and 29 are squared in the respective multipliers 30 and 31, and the results are added together in the adder 32. The resulting sum is the square of the instantaneous amplitude. If a signal normalized to unity is desired, the output signals of the filter must be multiplied by the reciprocal of the amplitude. For this purpose, there is stored in the PROM 33 the function $1/\sqrt{x}$, where x is the input value provided to the PROM, in this case, therefore, the squared amplitude. The reciprocal of the amplitude is accordingly provided at the output of the PROM 33, and it is used in the multipliers 34 and 35 for multiplication with the respective outputs of the filters 28 and 29. These multiplier outputs thus provide a pair of unity-normalized Hilbert-transform signals. In order to obtain a single-valued useful signal, the most recent previous value of one of these is multiplied with the present value of the other of the pair in the multipliers 38 and 39, and the multiplier outputs are algebraically added together in the adder 40. A translation of the resulting difference values by addressing the arc-sine table stored in PROM 41 then produces the digitally demodulated useful signal. A suitable low-pass filter, as illustrated at 150 (FIG. 14), with a gently rising characteristic that falls off above the limit frequency at the upper frequency limit of the signal to be transmitted therethrough can be used at the output to provide further processing to reduce or limit noise and, of course, a digital-to-analog converter, followed by an amplifier, is likely to be desirable for most applications. On the other hand, the digital output can be used directly for recording or for other processing, for example, digital stereo decoding of a received signal. Further processing, in any event, is similar to what is already the case in reproduction of signals from digital record disks or tapes.

A frequency of 2.14 MHz is a suitable sampling frequency for the analog-to-digital converters in the demodulation of an IF signal broadcast receiver. The further processing of the signal, after it comes out of the nonrecursive filters 28 and 29, takes place at 535 KHz. The squarers 30 and 31, the multipliers 34 and 35, 38 and 39, as well as the adders 32 and 40, can for example all be provided by a commercially available multiplier-accumulator (MAC), as is for example procurable from TRW under the designation TDC 1010 J. For this processing, in addition to the MAC, some intermediate stores are also necessary for the purpose, as more fully described below.

Figure 10:
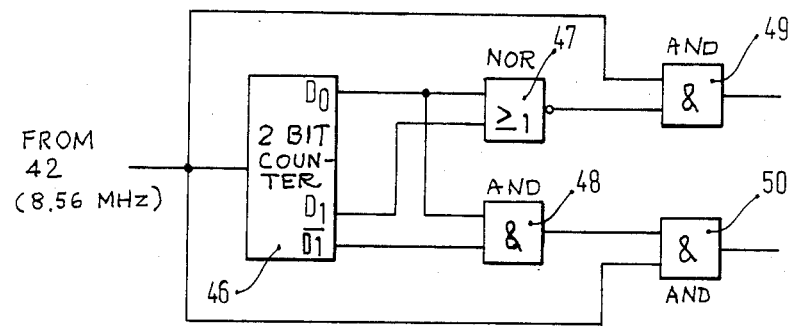
FIG. 10 is a detailed circuit of the demodulator of FIG. 9.

FIG. 10 shows a circuit for generation of clock (sampling or sample advancing) signals into sequences relatively offset by T/4. The output of the clock pulse generator 42 is provided to the input of a two-bit dual output counter 46 and also to one input of each of the AND-gates 49 and 50. The first output of the dual counter leads to one input of a NOR-gate 47 and to one input of a third AND-gate 48. The second output of the dual counter is provided to another input of the NOR-gate 47. The inverted second output of the dual counter 46 is supplied to another input of the third AND-gate 48. The output of the NOR-gate 47 is supplied to the second output of the AND-gate 49, while the output of the third output 48 is supplied to the second input of the AND-gate 50. The clock input of the analog-to-digital converter 21 is taken from the ouput of the AND-gate 49, while the clock input of the analog-to-digital converter 20 is taken from the output of the AND-gate 50.

Figure 11:
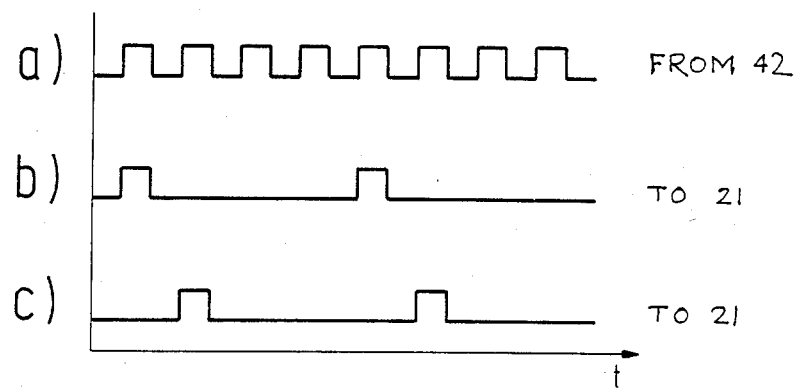
FIG. 11 is a pulse diagram for explaining the operation of the circuit of FIG. 10.

The manner of operation of the circuit of FIG. 10 is further explained with reference to the timing diagram given in FIG. 11. Line (a) represents the clock signal of the generator 42 provided to the input of the divider circuit of FIG. 10. Line (b) shows the signal at the output of the AND-gate 49, and line (c) the signal at the output of the AND-gate 50 resulting from the operation of the dual counter and the logic gates of FIG. 10. The pulses of line (b) and those of line (c) of FIG. 11 show a relative shift of T/4. On both line (b) and line (c), a pulse is provided on every fourth impulse of the pulse sequence of the pulse generator 42. In order to provide a clock frequency of 2.14 MHz at the outputs of the gates 49 and 50, it is necessary to drive the pulse generator at a frequency of 8.56 KHz.

Figure 12:
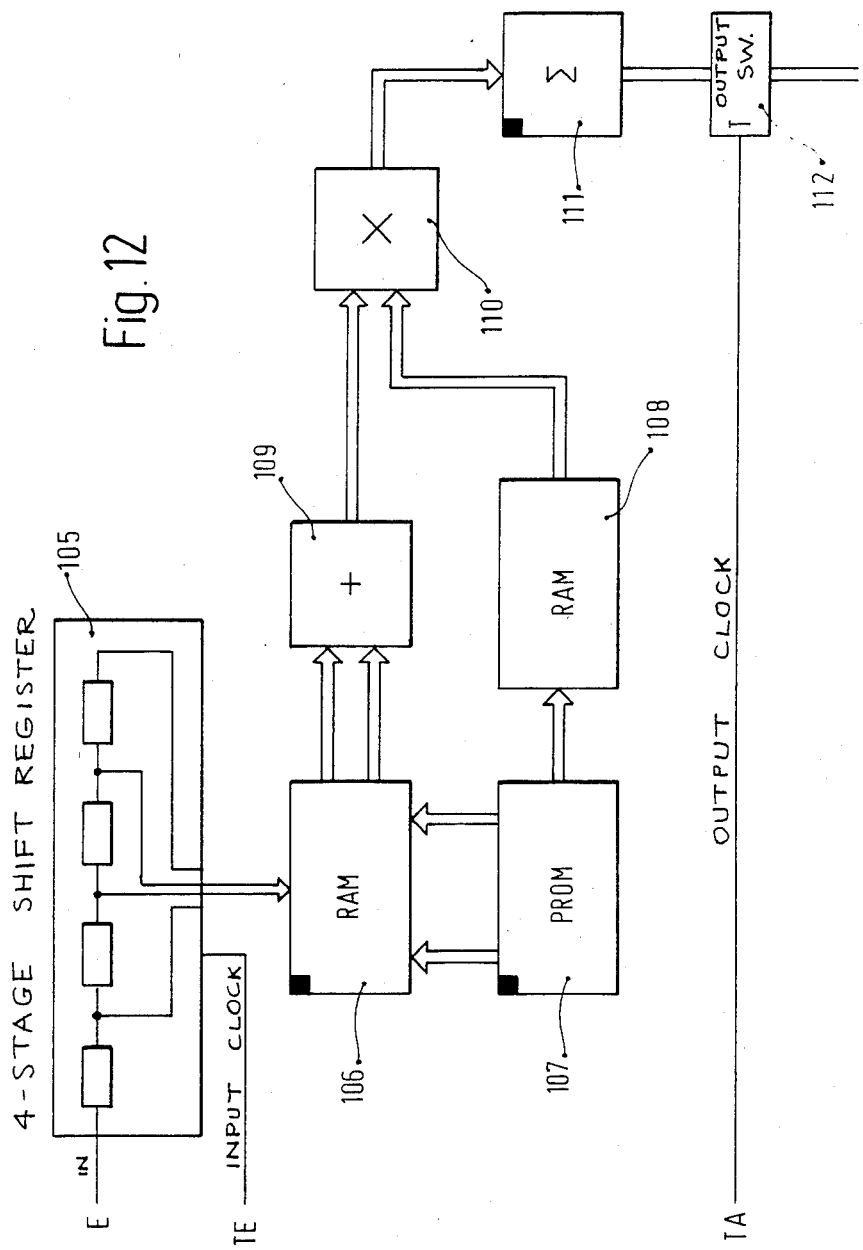
FIG. 12 is a circuit block diagram illustrating the circuitry of a non-recursive filter for the digital demodulators.

FIG. 12 illustrates a nonrecursive filter, such as is usable in the circuit block diagrams above described. The input signal is provided to a four-stage shift register 105, which has each of its shift register places connected to a RAM 106. The shift register is advanced by input clock pulses over the line TE. The RAM 106 has two outputs that are supplied to an adder 109. The output of the adder 109 is supplied to one input of a multiplier 110, the other input of which is connected with the output of a second RAM 108. The RAMs 106 and 108 are controlled by a PROM 107. The output of the multiplier 110 is supplied to a summing circuit 111 that is connected as an accumulator and has its output connected to an output switch which is controlled over the output clock pulse line TA and supplies the output signal of the nonrecursive filter.

Digital nonrecursive filters are essentially characterized by the fact that present values and past values of a signal are multiplied with prescribed coefficients by which the desired behavior of the filter is determined. The multiplied values are added and are thus made available at the output of the filter. Nonrecursive filters can be made with linear phase characteristic, a feature that can be provided when the coefficients have a mirror symmetry. This has the advantage that the number of time-consuming multiplications can be cut in half. For a filter order of eighteen, nineteen multiplications are in principle necessary, for example. In the case of linear-phase filters, the number of multiplications is reduced to ten. For this purpose, however, stored "condition variables" must be preliminarily added in pairs.

In the nonrecursive filter shown in FIG. 12, there is also the unusual feature of sample rate reduction. With each pulse of the input clock pulse line TE, the signal value at the input of the shift register 105 is picked up into the shift register and the previously picked-up value is shifted forward by one place. When four values are read in, the entire contents of the shift register 105 are transferred into the RAM 106, and the four stored values are deposited in four particular storage places of the RAM 106. Thereafter, four more values are read into the shift register 105, and these are likewise deposited in other storage places of the RAM 106. The last previously stored values in the RAM 106, corresponding in number to the coefficients, are then called up by the stored control information in PROM 107 in such a manner that every time the first and the last, the second and the next to the last, and so on, values are brought to the outputs of the RAM 106 and added together in the adder 109. At the same time, the corresponding coefficients in the RAM 108 are called up by the PROM 107, so that the corresponding coefficient may be multiplied with the first and the last signal value in the multiplier 110 and, likewise, the appropriate coefficient for multiplication with the next-to-the-last and second signal values, and so on. The products provided by the multiplier 110 are summed up in the accummulator 111. The number of multiplications in the multiplier 110 is reduced by the previous addition of two "condition variables" in the adder 109.

If the coefficients of the filter are not to be changed, these also may be stored in the PROM 107. If, however, a change of the coefficients and thus of the filter characteristics, for example, in dependence on the received signal, is to be provided for, it is useful to deposit the coefficients in a RAM, where they can be changed at their storage addresses. The sum value is read into the output register 112 where it remains available for an output clock period for further processing The addition of two condition variables and the multiplication with the coefficients is carried out every time, as soon as new values have been put into the RAM 106 by the shift register 105, so that after each transfer a new output value can be determined. The sample rate reduction results from the fact that only after a fourth value is put into the shift register 105 does a transfer of the entire contents read into the shift register 105 take place. The factor of the sample rate reduction therefore determines the minimum length of the shift register 105. The requirements placed on the multipliers and adders are quite high. In the case of a filter of grade 18, ten multiplications and additions are to be performed per clock cycle. In the case of filter of grade 38, twenty multiplications and additions per clock cycle must be carried out. It is also to be observed that the shift register 105 and the RAMs 106 and 108, as well as the computing components 109 to 111, must be designed corresponding to the width of the data word, for example for 8 bits at the input and 16 bits at the output. According to the required precision, the number of bits per word can be raised, since multiplication with higher dual counts are to be taken into account.

Figure 13:
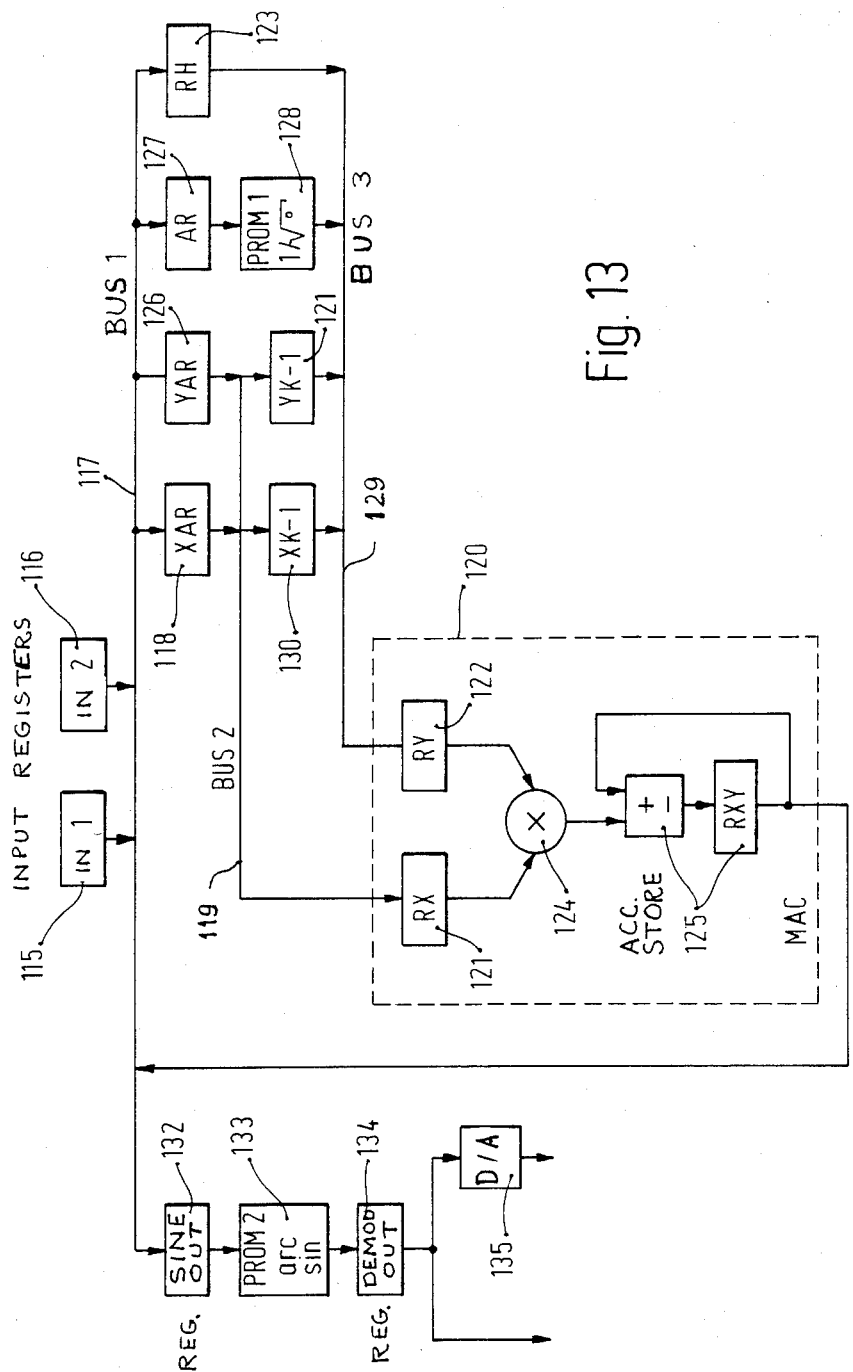
FIG. 13 is a further illustrative embodiment of a demodulator according to the invention.

For the constitution of a demodulator, for example one according to FIG. 2, there are required, in addition to an arc-sine converter, two multiplications, one addition and two registers serving as delay units. Furthermore, a few operations come into account for the amplitude compensation that has been explained: two squarings, one addition, one table for forming $1/\sqrt{x}$ and, finally, two further multiplications for correction of the AM-disturbed signals. A sequence of the necessary arithmetical operations can advantageously be carried out with a single multiplier-accumulator, as described in the reference "Multiplier-Accumulators, TRW-LSI Products, TRW Inc. 1979". A calculation assembly conceived in that manner is shown in FIG. 13 built around a 16-bit multiplier-accumulator (MAC) 120. The internally provided registers of this component are insufficient for all the necessary buffer store functions, so that additional external registers are required. Finally two PROM components are needed for the calculation of the instantaneous amplitudes and the arc-sine conversion.

At the input of the circuit are the registers 115 and 116 to which the filter output signals, for example from the filters 28 and 29 in FIG. 9, are provided. The outputs of the registers 115 and 116 lead to a data bus 117. The registers 118,126,127 and 123 are connected to the data bus 117. The outputs of the registers 118 and 126 lead to the second bus 119. The output of the register 127 is connected with the PROM 128 for forming square roots. The output of the register 123 is provided to the third data bus 129. The MAC 120 has two input registers 121 and 122, the first connected with the bus 119 and the second with the bus 129. The outputs of these two registers lead to a multiplier 124. The output of the multipliers 124 proceeds to an accumulator store 125. The output of the MAC leads back to the data bus 117 to which a first output register 132 is connected. A PROM 133 containing an arc-sine table follows the first output register 132 and makes the digitally demodulated signal available in the second output register 134. FIG. 13 also shows a digital-to-analog converter 135 for making an analog output signal also available.

The register values in the input registers 115 and 116 are first squared for amplitude correction by furnishing the content of the register 115 through the register 118 into the input register 121 of the MAC and also through the register 123 into the input register 122 of the MAC. After multiplication in the multiplier 124, the corresponding operation is performed for the signal in the register 116. After an accumulation step, the sum of the squares is provided in the accumulation register 125, from which it is passed through the register 127 to the PROM in which the square root of the reciprocal is formed. The amplitude correction factor thus calculated is then provided over the data bus 129 to the register 122 of the MAC. The input values in the registers 115 and 116 are, each in turn, loaded through the register 118 into the input store 121 of the MAC, multiplied and then normalized to unity with reference to the amplitude correction factor in the register 122. The normalized signals in the accumulator register 125 are each in turn loaded into the registers 118 and 126. Amplitude correction is thereby completed, and the actual demodulation follows.

For demodulation, the signal values stored in the registers 130 and 121 in the previous calculation cycle are multiplied with the present values available in the registers 118 and 126, and the two products are subtracted in the accumulator. The result then comes out to the first output register 132 for addressing the PROM 130 distortion elimination. The arc-sine table is so designed that for a deviation of 100 KHz, the maximum swing, therefore the amplitude 1, is produced at the output. With this last conversion, the demodulation cycle is completed. The FM signal obtained can be further processed digitally or provided in analog form through the digital-to-analog converter 135. Before a new cycle begins, however, the contents of the stores 118 and 126 are transferred to the registers 130 and 131 respectively.

Altogether, the operations just described require sixteen clock cycles. With reference to the above example with regard to frequencies and bandwidth, there is accordingly available in a total time of 1.87 microseconds just 116 nanoseconds for each elementary operation. Since the typical multiplication time of the currently usable multiplier-accumulators lies in the neighborhood of 150 ns, care must be taken to make two elementary operation cycles available for each of the six multiplication operations.

The control of the progress of the calculation is provided by a control PROM, not shown in the drawing, which is addressed by a 4-bit counter at a clock frequency of 8.65 MHz. The control signals are transferred through a pipeline register, not shown in the drawing, to the calculation assembly of FIG. 13.

The entire demodulators of the invention can advantageously be made in integrated circuit form. All of the storage units and calculation facilities can be put on one chip. Since the properties of the demodulator are substantially determined by the filter properties, by a simple change of the coefficients in the RAM 108 or in the ROM 107, the properties of the demodulator can be changed in order to fit it to different applications. The sampling frequencies are also determinable according to the application case. They can be selected to correspond to a changed carrier frequency or to another bandwidth of the analog preliminary filter. The precision of the demodulator depends essentially on the bit count of the word, and the bit count of its further processing. The precision of resolution can thereby be modified as desired.

Although the invention is described with reference to particular illustrative examples, it will be understood that modifications and variations are possible within the inventive concept.

I claim:

1. Digitally operating demodulator for FM signals comprising:
    means converting frequency modulated signals into digital form to provide digitalized signals;
    means, including a pair of nonrecursive filters, for respectively converting said digitalized signals into a pair of signal sequences which are substantially Hilbert transforms of each other, said filters having an output digital word rate which is lower than the input digital word rate of the filters;
    means for delaying the signals of each of said signal sequences;
    means for digitally multiplying the signals of each of said signal sequences by the contemporaneous delayed signal of the other signal sequence to produce contemporaneous product signal pairs, and
    means for producing the difference between each pair of product signals produced by said multiplying means.

2. Demodulator as defined in claim 1 in which arc-sine conversion means are provided having an input connected to the output of said difference producing means for providing at its output, for each input signal a signal having the value of the inverse sine of the input signal.

3. Digitally operating demodulator for FM signals comprising:
    means for providing two sequences of digital signals which are together representative of a frequency modulated signal, said sequences having the same sampling rate but being offset in time by a fraction of the sampling period of the individual sequences;
    a pair of nonrecursive filters, said filters respectively having said sequences of digital signals as an input and both said filters having an output signal sample rate which is lower than the sampling rate of the input signal sequences;
    interpolation means for modifying the output of at least one of said filters for converting the filter output into a pair of signal sequences which are approximately Hilbert transforms of each other;
    means for delaying the signals of each of said signal sequences;
    means for multiplying the signals of each of said signal sequences by the contemporaneous delayed signal of the other signal sequence, and
    means for producing the difference within each contemporaneous pair of products produced by said multiplying means.

4. Demodulator as defined in claim 3 in which arc-sine conversion means are provided having an input connected to the output of said difference producing means for providing at its output, for each input signal, a signal having the value of the inverse sine of the input signals.

5. Demodulator as defined in claim 3 in which said interpolation means includes shift means (24, 27) and addition means (26) for providing the multiplication and addition necessary for interpolation.

6. Demodulator as defined in claim 3 in which means are included for detecting the amplitude of FM signals represented by said digital signals and for providing amplitude-dependent correction to the operation of the demodulator.

7. Demodulator as defined in claim 6 in which said amplitude detecting and demodulator correcting means comprises means for squaring and adding together the values of the output signals of the respective nonrecursive filters and means for utilizing the resulting sums for providing multiplication of the output signals of said nonrecursive filters having the effect of normalizing them to a reference amplitude value.

8. Demodulator as defined in claim 7 in which said sum utilizing means comprises means for producing the square root of the reciprocal of the output signal value of said squaring and adding means and utilizing said square root of said reciprocal as a normalizing factor applied to the output signals of said nonrecursive filters.

9. Demodulator as defined in claim 3 in which said fraction of the sampling period is one-quarter and in which said output signal sample rate of said filters is one-quarter of the sampling rate of said input signal sequences.

10. Digitally operated demodulator for FM signals which have been digitalized at a sampling rate not substantially less than twice the bandwidth of the FM signal just before it is digitalized, said demodulator comprising:

means for multiplying said digitalized signals with a sine function to produce a first sequential set of multiplied signals;
means for multiplying said digitalized signals with a cosine function to produce a second sequential set of multiplied signals;
nonrecursive filter means for each of said sets of multiplied signals for completing conversion of said digitalized signals into third and fourth sets of digital signals which are substantially Hilbert transforms of each other;
means for delaying for a predetermined period the signals of said third and of fourth sets of digital signals, and for providing delayed signals of said third and fourth sets;
means for multiplying the undelayed signals of said third set with the delayed signals of said fourth set of digital signals to produce first product digital signals and for multiplying the undelayed signals of said fourth set by the delayed signals of said third set to produce a second set of product digital signals, and
means for providing difference digital signals by determining the difference between members of each pair of contemporaneous product digital signals, of which one is from said first set of product digital signals and the other is from the second set of product digital signals.

11. Demodulator as defined in claim 10, in which arc-sine conversion means are provided having an input connected to the output of said difference signals providing means for producing at its output, for each input signal, a signal having the value of the inverse sine of the input signals.

12. Demodulator as defined in claim 10, in which digital nonrecursive filters constituting a second pair of digital nonrecursive filters for said demodulator are respectively interposed between the outputs of said filters of the first pair and said filter output delaying means.

13. Demodulator as defined in claim 10, in which said means for multiplying by said sine function and by said cosine function are constituted for providing multiplication only at the zero transitions and extreme values of said sine and cosine functions.

14. Demodulator as defined in claim 13, in which said means for multiplying by said sine and by said cosine function are constituted by fixed value memory means (89,90) for blanking, passing and sign-changing operations on the digitalized signals of said first and second sets.

15. Demodulator as defined in claim 10, in which the signal sample rate at the output of each nonrecursive filter is lower than that at the input of the filter.

16. Demodulator as defined in claim 12, in which the signal sample rate at the output of each nonrecursive filter is lower than that at the input of the filter.

17. Demodulator as defined in claim 1 or claim 3, in which each said nonrecursive filter comprises an input shift register (105), a storage unit (106) for receiving sets of signal values collected in said shift register for processing as condition variables, means (108) for storing coefficients for said condition variables by which the properties of the filter are determined, means for multiplying said condition variables by said coefficients and for summing the products in an accummulator (111).

18. Demodulator as defined in claim 17, in which means are provided for calling up together the signal values of each said set from said shift register which are to be multiplied by the same coefficient, adding said called up signal values together and furnishing their sum to said multiplying means for multiplication by said coeffient in a single step before summing in said accumulator (111).

19. Demodulator as defined in claim 17, in which said shift register (105) has a number of places that is at least equal to the sampling rate reduction factor integer by which the rate of advance of said shift register is divided to the rate of transfer of signal sets out of said shift register.

20. Demodulator as defined in claim 17, in which means are provided for altering said stored coefficients for varying the properties of the nonrecursive filter automatically or manually.

21. Demodulator as defined in claim 1 or claim 3, in which a distortion reducing filter is provided at the demodulator output with a gently rising characteristic that falls off above a limiting frequency at the upper frequency limit of the signal to be transmitted therethrough.

22. Demodulator as defined in claim 1 or claim 3, in which a bandpass filter is provided at the input which precedes means for converting the FM signal to be demodulated into digital form.

23. Demodulator as defined in claim 10, in which means are included for detecting the amplitude of FM signals represented by said digital signals and for providing amplitude-dependent correction to the operation of the demodulator.

24. Demodulator as defined in claim 23, in which said amplitude detecting and demodulator correcting means comprise means for squaring and adding together the values of the output signals of the respective members of said second pair of nonrecursive filters and means for utilizing the resulting sums for providing multiplication of the output signals of said nonrecursive filters of said second pair, so as to produce the effect of normalizing a reference amplitude value of said output signals of said last pair of nonrecursive filters.

25. Method of digitally demodulating signals, comprising the steps of:

deriving from frequency modulated signals two sequences of digital signals having the same sampling rate, but being relatively offset in time by a fraction of the sampling period,
passing said two sequences of digital signals respectively through separate nonrecursive filters having an output signal sample rate which is lower than the sampling rate of said signal sequences as provided to the input of said filters,
modifying at least one of the output signal sequences produced by said nonrecursive filtering step by an interpolation process compensating for said relative time offset of said signal sequences and thereby converting the output signal sequences resulting from said filtering step into a pair of signal sequences which are approximately hilbert transforms of each other, delaying each filter output signal sequence for one sample period so that both the delayed and the undelayed filter output signal sequence is available for further processing, multiplying the undelayed signals of each of said filter output signal sequences by the contemporaneous delayed signal of the other of said filter output signal sequences, and obtaining a difference signal by a subtraction process comparing each multiplication product signal contemporaneously produced by said multiplying step.

26. Method of digitally demodulating fm signals, comprising the steps of:

digitalizing frequency modulated signals at a sampling rate not substantially less than twice the bandwidth of the fm signal just before it is digitalized, multiplying said digitalized signals with a sine function to produce a first sequential set of multiplied signals;

multiplying said digitalized signals with a cosine function to produce a second sequential set of multiplied signals, nonrecursively filtering each of said sets of multiplied signals and simultaneously reducing the sampling rate, thereby completing a conversion of said digitalized signals into third and fourth sets of digitalized signals which are substantially hilbert transforms of each other and have a sampling rate lower than the sampling rate of said digitalized signals by a numerically integral factor, delaying by one sampling period the respective signals of said third and fourth sets of digital signals so that delayed and undelayed signals of each of said third and fourth sets are available for further processing, multiplying the undelayed signals of said third set with the delayed signals of said fourth set of digital signals to produce first product digital signals, multiplying the undelayed signals of said fourth set with the delayed signals of said third set of digital signals to produce second product digital signals, and determining the difference in value between each of said first product digital signals and the contemporaneous one of said second product digital signals.

27. Method according to claim 25 or claim 26, in which a final step is added of subjecting the difference signals to an arc-sine conversion for removing sine function distortion.

* * * * *